United States Patent
Flaherty et al.

(10) Patent No.: US 6,723,916 B2
(45) Date of Patent: Apr. 20, 2004

(54) COMBINATION EMI SHIELDING AND ENVIRONMENTAL SEAL GASKET CONSTRUCTION

(75) Inventors: Brian F. Flaherty, Stoneham, MA (US); Jonathan E. Mitchel, Norwood, MA (US); John M. Perkins, Wilmington, MA (US); Ronald P. Romano, Acton, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 10/368,828

(22) Filed: Feb. 18, 2003

(65) Prior Publication Data

US 2003/0173100 A1 Sep. 18, 2003

Related U.S. Application Data

(60) Provisional application No. 60/365,121, filed on Mar. 15, 2002.

(51) Int. Cl.⁷ ............................................. H05K 9/00
(52) U.S. Cl. ................................. 174/35 GC; 277/920
(58) Field of Search ..................... 174/35 GC, 35 MS, 174/35 R; 361/816, 818; 277/650, 652, 653, 920, 644, 654

(56) References Cited

U.S. PATENT DOCUMENTS

| 2,755,079 A | 7/1956 | York et al. |
| 2,974,183 A | 3/1961 | Kes et al. |
| 3,026,367 A | 3/1962 | Hartwell |

(List continued on next page.)

FOREIGN PATENT DOCUMENTS

| CA | 903020 | 6/1972 |
| EP | 0 643 551 A1 | 3/1995 |
| EP | 0 643 552 A1 | 3/1995 |
| EP | 1 094 257 A2 | 4/2001 |
| JP | 507177 | 1/1993 |
| WO | WO 93/23226 | 11/1993 |
| WO | WO 95/07603 | 3/1995 |
| WO | WO 96/22672 | 7/1996 |
| WO | WO 01/54467 | 7/2001 |
| WO | WO 01/71223 | 9/2001 |

OTHER PUBLICATIONS

Chomerica Metal EMI Gaskets Metakip Clip–On EMI Gasket data sheet. Applicants request the Examiner to consider this reference as prior art under 102 (a), however, Applicants respectfully reserve the right to supplement this Information Disclosure Statement and take a contrary position should it be necessary.

Chomerics Metal EMI Gaskets COMBO® STRIP Gaskets data sheets. Applicants request the Examiner to consider this reference as prior art under 102(a), however, Applicants respectfully reserve the right to supplement this Information Disclosure Statement and take a contrary position should it be necessary.

(List continued on next page.)

*Primary Examiner*—Dean A. Reichard
*Assistant Examiner*—Carmelo Oliva
(74) *Attorney, Agent, or Firm*—John A. Molnar, Jr.

(57) ABSTRACT

A combination EMI shielding and environmental sealing gasket construction and method for its manufacture. The gasket includes at least one electrically-conductive EMI shielding gasket member, and at least one environmental sealing gasket member. The shielding gasket member, which may be in the form of a strip, has a lengthwise extent and an outer periphery having interstitial spaces, such as between the fibers of a metal wire or other fiber mesh or fabric, through a widthwise extent thereof. The sealing gasket member extends along the lengthwise extent of the shielding gasket member and is formed, such as by being dispensed to foam or otherwise formed-in-place along an adjacent side of the strip, of an elastomeric foam or other material which penetrates into at least a portion of the interstitial spaces of the shielding gasket member to bond the shielding gasket member and the sealing gasket member into an integral structure.

36 Claims, 5 Drawing Sheets

U.S. PATENT DOCUMENTS

| | | |
|---|---|---|
| 4,065,138 A | 12/1977 | Severinsen |
| 4,181,313 A | 1/1980 | Hillier et al. |
| 4,419,168 A | 12/1983 | Paul |
| 4,441,726 A | 4/1984 | Uhl |
| 4,529,257 A | 7/1985 | Goodman et al. |
| 4,643,864 A | 2/1987 | Martini |
| 4,652,695 A | 3/1987 | Busby |
| 4,857,668 A | 8/1989 | Buonanno |
| 4,864,076 A | 9/1989 | Stickney |
| 4,871,477 A | 10/1989 | Dimanshteyn |
| 4,931,326 A | 6/1990 | Weil |
| 4,931,479 A | 6/1990 | Morgan |
| 4,968,854 A | 11/1990 | Benn, Sr. et al. |
| 4,979,280 A | 12/1990 | Weil |
| 5,028,739 A | 7/1991 | Keyser et al. |
| 5,068,493 A | 11/1991 | Benn, Sr. et al. |
| 5,105,056 A | 4/1992 | Hoge, Jr. et al. |
| 5,107,070 A | 4/1992 | Benn, Sr. et al. |
| 5,115,104 A | 5/1992 | Bunyan |
| 5,142,101 A | 8/1992 | Matsuzaki et al. |
| 5,202,536 A | 4/1993 | Buonanno |
| 5,294,270 A | 3/1994 | Fenical |
| 5,617,900 A * | 4/1997 | Weil .......................... 138/127 |
| 5,641,438 A | 6/1997 | Bunyan et al. |
| 5,731,541 A | 3/1998 | Bernd et al. |
| 5,855,818 A | 1/1999 | Gan et al. |
| 5,882,729 A | 3/1999 | Kahl et al. |
| 5,902,956 A * | 5/1999 | Spies et al. ............ 174/35 GC |
| 5,910,524 A | 6/1999 | Kalinoski |
| 6,056,527 A | 5/2000 | Bunyan et al. |
| 6,096,158 A | 8/2000 | Kahl et al. |
| 6,096,413 A | 8/2000 | Kalinoski et al. |
| 6,173,970 B1 * | 1/2001 | Choudary et al. .......... 277/644 |
| 6,462,267 B1 * | 10/2002 | Spies et al. ............ 174/35 GC |
| 2002/0010233 A1 | 1/2002 | Botrie |

OTHER PUBLICATIONS

Chomerics Metal EMI Gaskets MESH STRIP* All Metal Gaskets data sheets. Applicants request the Examiner to consider this reference as Prior art under 102 (a), however, Applicants respectfully reserve the right to supplement this Information Disclosure Statement and take a contrary position should it be necessary.

Chomerics Metal EMI SHIELDMESHO Compressed Mesh. Gaskets data sheet. Applicants request the Examiner to Consider this reference as prior art under 102(a), however, Applicants respectfully reserve the right to supplement this Information Disclosure Statement and take a contrary position should it be necessary.

Chomerics Technical Bulleting 114—SPRINGMESH(–) Highly Resilient EMI Mesh Gasket. Applicants request the Examiner to consider this reference as prior art under 102(a), however, Applicants respectfully reserve the right to supplement this Information Disclosure Statement and take a contrary position should it be necessary.

Pages 79 and 130 of Chomerics EMI Shielding Military/Aerospace ELectronics Handbook printed 1996.

Miscellaneous pages from Chomerics EMI Shielding Engineering Handbook printed 1989/90.

* cited by examiner

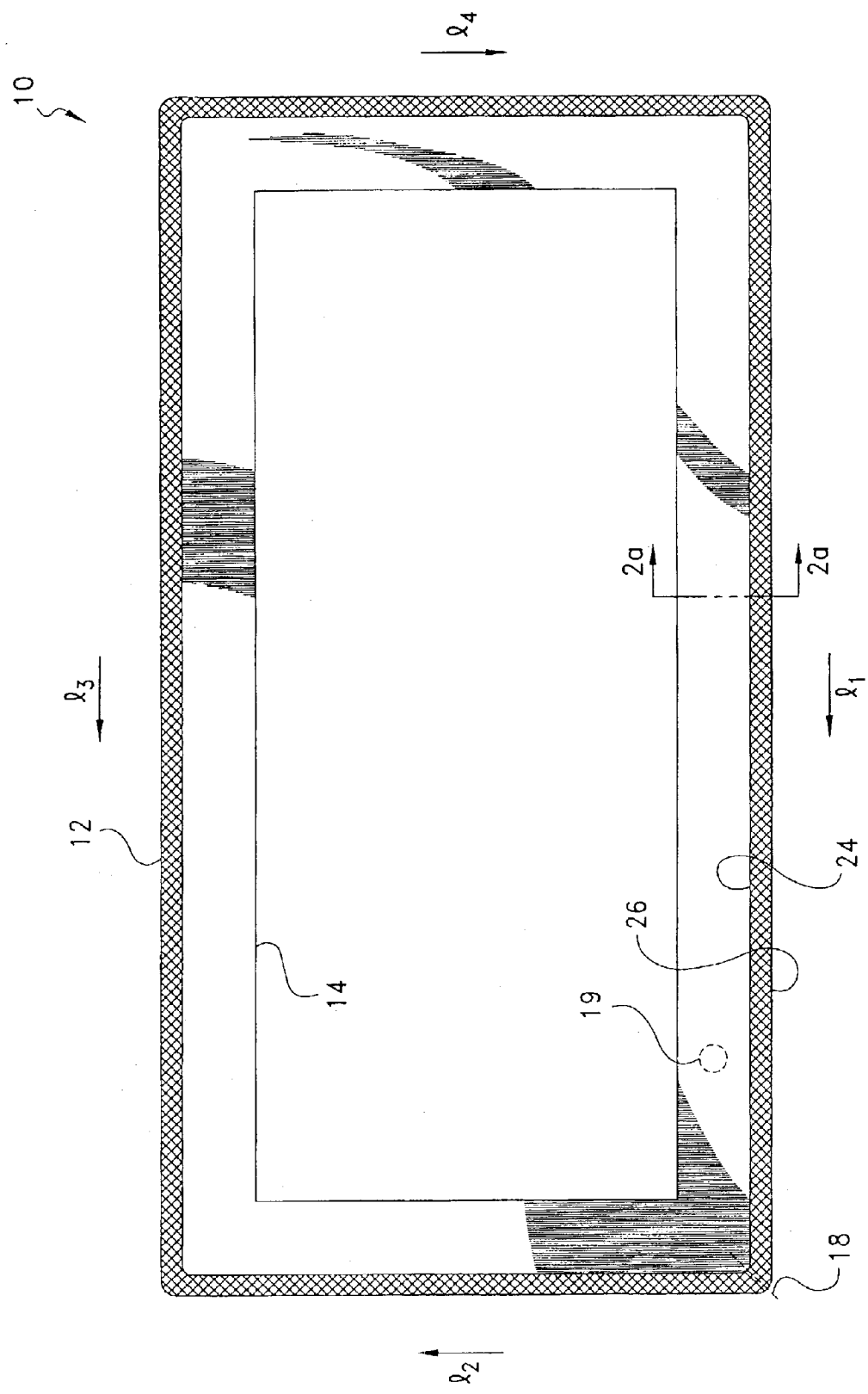

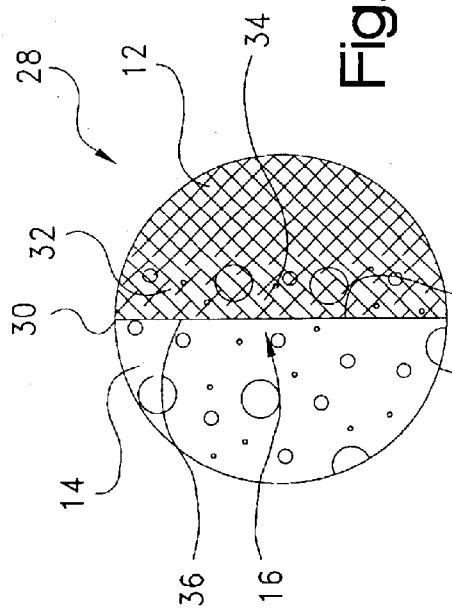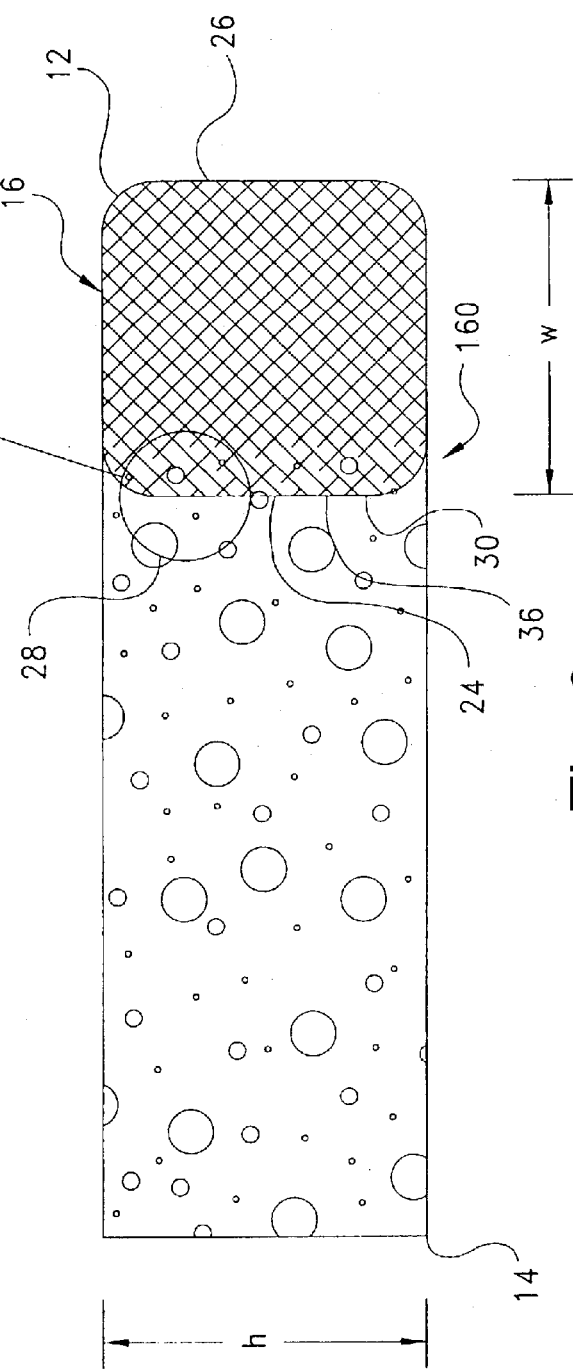

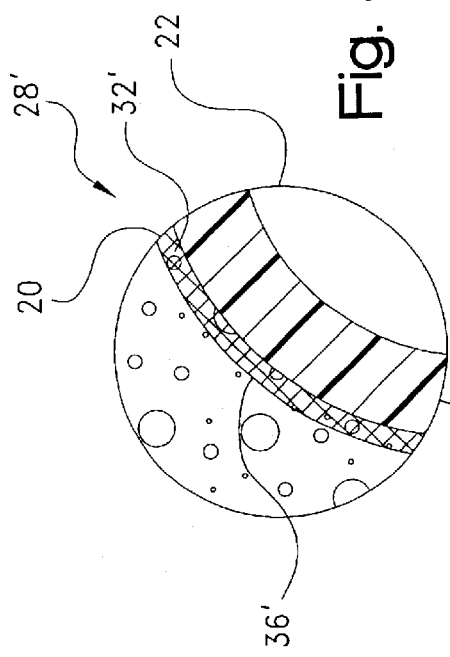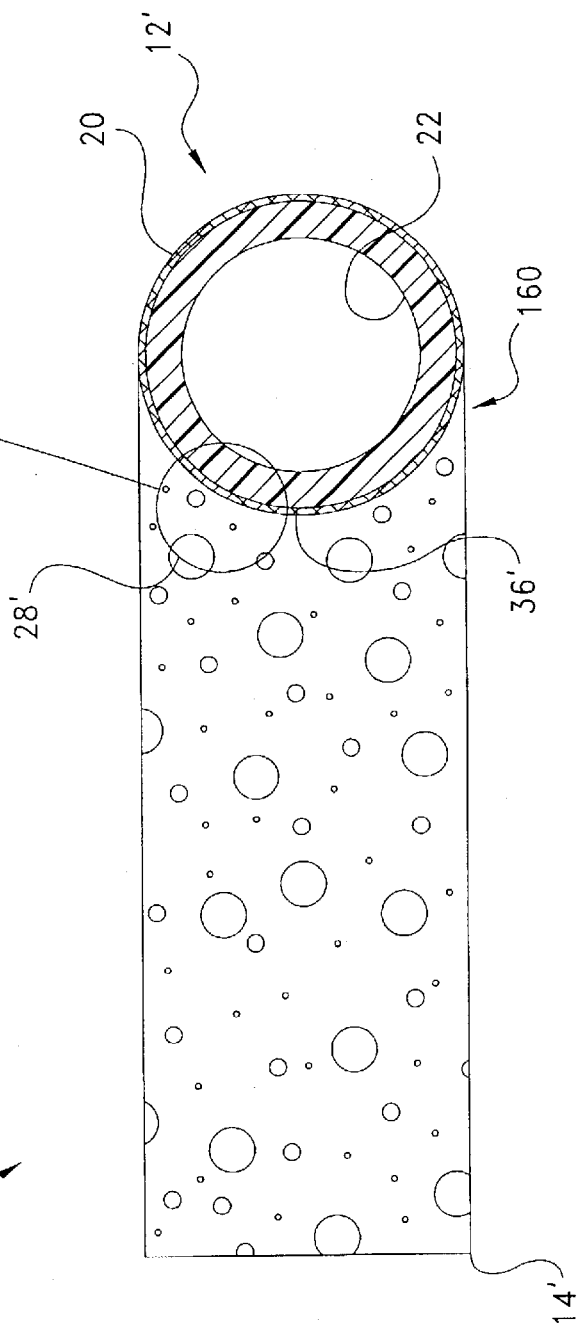

COMBINATION EMI SHIELDING AND ENVIRONMENTAL SEAL GASKET CONSTRUCTION

CROSS-REFERENCE TO RELATED CASES

The present application claims the benefit of the filing date of U.S. Provisional Application Serial No. 60/365,121; filed Mar. 15, 2002, the disclosure of which is expressly incorporated herein by reference

BACKGROUND OF THE INVENTION

The present invention relates broadly to gaskets for providing electromagnetic interference (EMI) shielding and weather, dust, or other environmental sealing, and particularly to a combination or composite gasket construction and method of its manufacture combining a metal mesh strip gasket with an integral solid or foam elastomeric weather-sealing strip which is especially adapted for use within cabinets and other enclosures for electrical or electronic systems or devices.

The operation of electronic devices such as televisions, radios, computers, medical instruments, business machines, communications equipment, and the like is attended by the generation of electromagnetic radiation within the electronic circuitry of the equipment. As is detailed in U.S. Pat. Nos. 5,202,536; 5,142,101; 5,105,056; 5,028,739; 4,952,448; and 4,857,668, such radiation often develops as a field or as transients within the radio frequency band of the electromagnetic spectrum, i.e., between about 10 KHz and 10 GHz, and is termed "electromagnetic interference" or "EMI" as being known to interfere with the operation of other proximate electronic devices.

To attenuate EMI effects, shielding having the capability of absorbing and/or reflecting EMI energy may be employed both to confine the EMI energy within a source device, and to insulate that device or other "target" devices from other source devices. Such shielding is provided as a barrier which is inserted between the source and the other devices, and typically is configured as an electrically conductive and grounded housing which encloses the device. As the circuitry of the device generally must remain accessible for servicing or the like, most housings are provided with openable or removable accesses such as doors, hatches, panels, or covers. Between even the flattest of these accesses and its corresponding mating or faying surface, however, there may be present gaps which reduce the efficiency of the shielding by presenting openings through which radiant energy may leak or otherwise pass into or out of the device. Moreover, such gaps represent discontinuities in the surface and ground conductivity of the housing or other shielding, and may even generate a secondary source of EMI radiation by functioning as a form of slot antenna. In this regard, bulk or surface currents induced within the housing develop voltage gradients across any interface gaps in the shielding, which gaps thereby function as antennas which radiate EMI noise. In general, the amplitude of the noise is proportional to the gap length, with the width of the gap having less appreciable effect.

For filling gaps within mating surfaces of housings and other EMI shielding structures, gaskets and other seals have been proposed both for maintaining electrical continuity across the structure, and for excluding from the interior of the device such contaminates as moisture and dust. Such seals are bonded or mechanically attached to, or press-fit into, one of the mating surfaces, and function to close any interface gaps to establish a continuous conductive path thereacross by conforming under an applied pressure to irregularities between the surfaces. Accordingly, seals intended for EMI shielding applications are specified to be of a construction which not only provides electrical surface conductivity even while under compression, but which also has a resiliency allowing the seals to conform to the size of the gap. The seals additionally must be wear resistant, economical to manufacture, and capability of withstanding repeated compression and relaxation cycles. EMI shielding gaskets and other electrically-conductive materials, their methods of manufacture, and their use are further described in U.S. Pat. Nos. 6,121,545; 6,096,413; 6,075,205; 5,996,220; 5,910,524; 5,902,956; 5,902,438; 5,882,729; 5,804,762; 5,731,541; 5,641,438; 5,603,514; 5,584,983; 5,578,790; 5,566,055; 5,524,908; 5,522,602; 5,512,709; 5,438,423; 5,294,270; 5,202,536; 5,142,101; 5,141,770; 5,136,359; 5,115,104; 5,107,070; 5,105,056; 5,068,493; 5,054,635; 5,049,085; 5,028,739; 5,008,485; 4,988,550; 4,979,280; 4,968,854; 4,952,448; 4,931,479; 4,931,326; 4,871,477; 4,864,076; 4,857,668; 4,800,126; 4,529,257; 4,441,726; 4,301,040; 4,231,901; 4,065,138; 3,758,123; 3,026,367; 2,974,183; and 2,755,079, in U.S. patent appln. Publ. No. 20020010223, International (PCT) Patent Appln. Nos. WO 01/71223; 01/54467; 00/23,513; 99/44,406; 98/54942; 96/22672; and 93/23226, Japanese Patent Publication (Kokai) No. 7177/1993, European Pat. Appln. No. 1,094,257, German Patent No. 19728839, and Canadian Patent No. 903,020, in Severinsen, J., "Gaskets That Block EMI," Machine Design, Vol. 47, No. 19, pp. 74–77 (Aug. 7, 1975), and in the following publications of the Chomerics Division of Parker Hannifin Corporation, Woburn, Mass.: "SOFT-SHIELD® 1000 Series;" "SOFT-SHIELD® 2000 Series;" "SOFT-SHIELD® 4000 Series;" "SOFT-SHIELD® 5000 Series;" and "SOFT-SHIELD® 5500, Preliminary Product Data Sheet (1998) Series; "COMBO® STRIP Gaskets;" "SPRINGMESH™ Highly Resilient EMI Mesh Gasket," Technical Bulletin 114; "METAL STRIP® All Metal Gaskets;" "SHIELDMESH™ Compressed Mesh Gaskets;" and "METALKLIP® Clip-On EMI Gasket."

EMI shielding gaskets typically are constructed as a resilient element, or a combination of one or more resilient elements having gap-filling capabilities. One or more of the elements may be provided as a tubular or solid, foamed or unfoamed core or strip which is filled, sheathed, or coated to be electrically-conductive, or otherwise which is formed of an inherently conductive material such as a metal wire spring mesh. One or more of the other elements, and particularly in the case of a composite or "combination gasket" having a conductive EMI shielding element in combination with an integral weather sealing strip (such as is sold commercially by the Chomerics Division of Parker-Hannifin Corporation (Woburn, Mass.) under the name "COMBO® STRIP Gasket"), may be formed of a sheet, strip, "picture-frame," or other open or closed geometry of a solid, i.e., unfoamed, or foamed elastomeric material providing enhanced environmental sealing capabilities to which the conductive element is adhesively-bonded or otherwise joined. Each of the core or strip of the conductive element and the elastomeric material of the environmental sealing element may be formed of an elastomeric thermoplastic material such as polyethylene, polypropylene, or polyvinyl chloride, a thermoplastic or thermosetting rubber such as a butadiene, styrene-butadiene, nitrile, chlorosulfonate, neoprene, urethane, or silicone, or a blend such as polypropylene-EPDM. Conductive materials for the filler, sheathing, or coating of the conductive element include metal or metal-plated particles, fabrics, meshes, and fibers. Preferred metals include copper, nickel, silver, aluminum, tin or an alloy such as Monel, with preferred fibers and fabrics including natural or synthetic fibers such as cotton, wool, silk, cellulose, polyester, polyamide, nylon, polyimide. Alternatively, other conductive particles and fibers such as carbon, graphite, or a conductive polymer material may be substituted.

Conventional manufacturing processes for EMI shielding gaskets include extrusion, molding, or die-cutting, with molding or die-cutting heretofore being preferred for particularly small or complex shielding configurations. In this regard, die-cutting involves the forming of the gasket from a cured sheet of an electrically-conductive elastomer which is cut or stamped using a die or the like into the desired configuration. Molding, in turn, involves the compression or injection molding of an uncured or thermoplastic elastomer into the desired configuration.

More recently, a form-in-place (FIP) process has been proposed for the manufacture of EMI shielding gaskets. As is described in commonly-assigned U.S. Pat. Nos. 6,096, 413; 5,910,524; 5,641,438; 4,931,479, and International (PCT) Patent Appln. No. 96/22672; and in U.S. Pat. Nos. 5,882,729 and 5,731,541, International (PCT) Patent Appln. No. WO 01/71223, and Japanese Patent Publication (Kokai) No. 7177/1993, such process involves the application of a bead of a viscous, curable, electrically-conductive composition which is dispensed in a fluent state from a nozzle directly onto to a surface of a substrate such as a housing or other enclosure. The composition, typically a silver-filled or otherwise electrically-conductive silicone or polyurethane foamed or unfoamed elastomer, then is foamed and/or cured-in-place via a chemical, thermal, or physical reaction which may be initiated or catalyzed via the application of heat or with atmospheric moisture or ultraviolet (UV) radiation to form an electrically-conductive, elastomeric EMI shielding gasket profile in situ on the substrate surface. By forming and curing the gasket in place directly on the substrate surface, the need for separate forming and installation steps is obviated. Moreover, the gasket may be adhered directly to the surface of the substrate to further obviate the need for a separate adhesive component or other means of attachment of the gasket to the substrate. In contrast to more conventional die cutting or molding processes, the flashless FIP process reduces waste generation, and additionally is less labor intensive in that the need for hand assembly of complex gasket shapes or the mounting of the gasket into place is obviated. The process further is amenable to an automated or robotically-controlled operation, and may be employed to fabricate complex gasket geometries under atmospheric pressure and without the use of a mold.

As electronic devices continue to proliferate, it is believed that additional EMI shielding products and methods of manufacture therefor would be well-received by the electronics industry.

BROAD STATEMENT OF THE INVENTION

The present invention is directed to a combination EMI shielding and environmental sealing gasket construction and method of manufacturing the same which is especially adapted for use in "picture-frame" and complex geometric configurations and/or in applications requiring a high level of weather or other environmental sealing such as in outdoor cabinets. The gasket construction includes one or more electrically-conductive EMI shielding gasket members, each of which may be a mesh, spring mesh, or an elastomeric or foam core covered in a mesh, and one or more integral environmental sealing members which may be robotically dispensed or otherwise formed-in-place around the shielding members as formed of a foamed or unfoamed elastomer.

In an illustrative embodiment, the one or more shielding gasket members may be provided as a resilient strip of a mesh or spring mesh which may have a generally circular, oval, "D," polygonal, or other shape cross-section and which may be preformed by conventional methods into the geometry, which may be a closed geometric shape such as a circle, square, rectangle, or other "picture frame"-like shape, of the cabinet door or other structure, equipment, or device to be sealed.

Alternatively, the shielding gasket members may be provided as individual strips. In whatever form provided, the members may be placed, typically in a spaced-apart arrangement in the case of two or more members, in a grooved formed into a mold or other tool or, alternatively, directly into the cabinet, door, access panel, housing, or other structure to be sealed, such groove having a width which is sized relative to the widthwise extents of the members to define a predefined clearance therebetween corresponding to the desired widthwise extent of the sealing member which is to be formed. With the one or more shielding members being received in the groove, a form-in-place (FIP) gasket material may be dispensed, such as from a nozzle which may be robotically-controlled or by other automated means, within the groove along at least a portion of one or both sides of at least one of the shielding gasket members. With the dispensed material being foamed or otherwise expanding or flowing within the groove, the material thus is made to penetrate through the open spaces or interstices of the mesh and into at least a portion of the widthwise dimension of the shielding gasket member.

Upon the curing of the material, one or both of the shielding gasket members are at least partially embedded within the material which otherwise forms one or more environment sealing members, typically having a D-shaped profile characteristic of formed-in-place seals, between the shielding gasket members and/or between such members and the side walls of the groove. Optionally, the free surface of the sealing gasket being formed may be contained within a by a molding plate or other forming tool so as to effect the forming of the sealing gasket into a different profile such as a square or rectangle. Advantageously, by virtue of the penetration of the sealing material into the interstices of the mesh, the shielding and sealing gasket members are thereby mechanically and/or, depending upon the composition of the sealing material, which may be a polyurethane or silicone foam, adhesively or otherwise chemically bonded to form an integral combination gasket structure, with the need to bond the members together using a separate adhesive layer or otherwise in a separate joining operation being obviated.

The combination of the gasket of the invention may be produced in frames, sheets strips, or other forms which may be mounted to the structure to be sealed. Alternatively, the gasket construction may be formed-in-placed directly on the structure to be sealed.

The present invention, accordingly, comprises the articles and methods of manufacture possessing the construction, combination of elements, and arrangement of parts and steps which are exemplified in the detailed disclosure to follow. Advantageously, the gasket construction and form-in-place method of the present invention facilitate the net shape manufacture of picture-frame and other complex shapes or patterns of any dimension and which may include internal openings with less waste as compared, for example, to a die-cut part. Such construction and method, moreover, are amenable to the use of automated processing equipment and obviate the need for splicing and other operations which conventionally are preformed by hand. Thus, the gasket construction and method of the invention are particularly reliable and economical, and may be used in a variety of configurations, such as sheets, strips, pads, picture-frames, and die-cut-like patterns, in thin or thick cross-sections, and in a host of shielding and/or grounding applications such as for door or access panels, vents, and covers of cabinets and other enclosures. These and other advantages will be readily apparent to those skilled in the art based upon the disclosure contained herein.

BRIEF DESCRIPTION OF THE DRAWING

For a fuller understanding of the nature and objects of the invention, reference should be had to the following detailed description taken in connection with the accompanying drawing wherein:

FIG. 1 is a top view showing a representative combination gasket construction according to the present invention;

FIG. 2A is a cross-sectional view of the gasket construction of FIG. 1 taken through line 2A—2A of FIG. 1;

FIG. 2B is a magnified view of a portion of FIG. 2A;

FIG. 3A is a cross-sectional view as in FIG. 2A showing an alternative embodiment of the gasket construction of FIG. 1;

FIG. 3B is a magnified view of a portion of FIG. 3A;

Figure 4A:
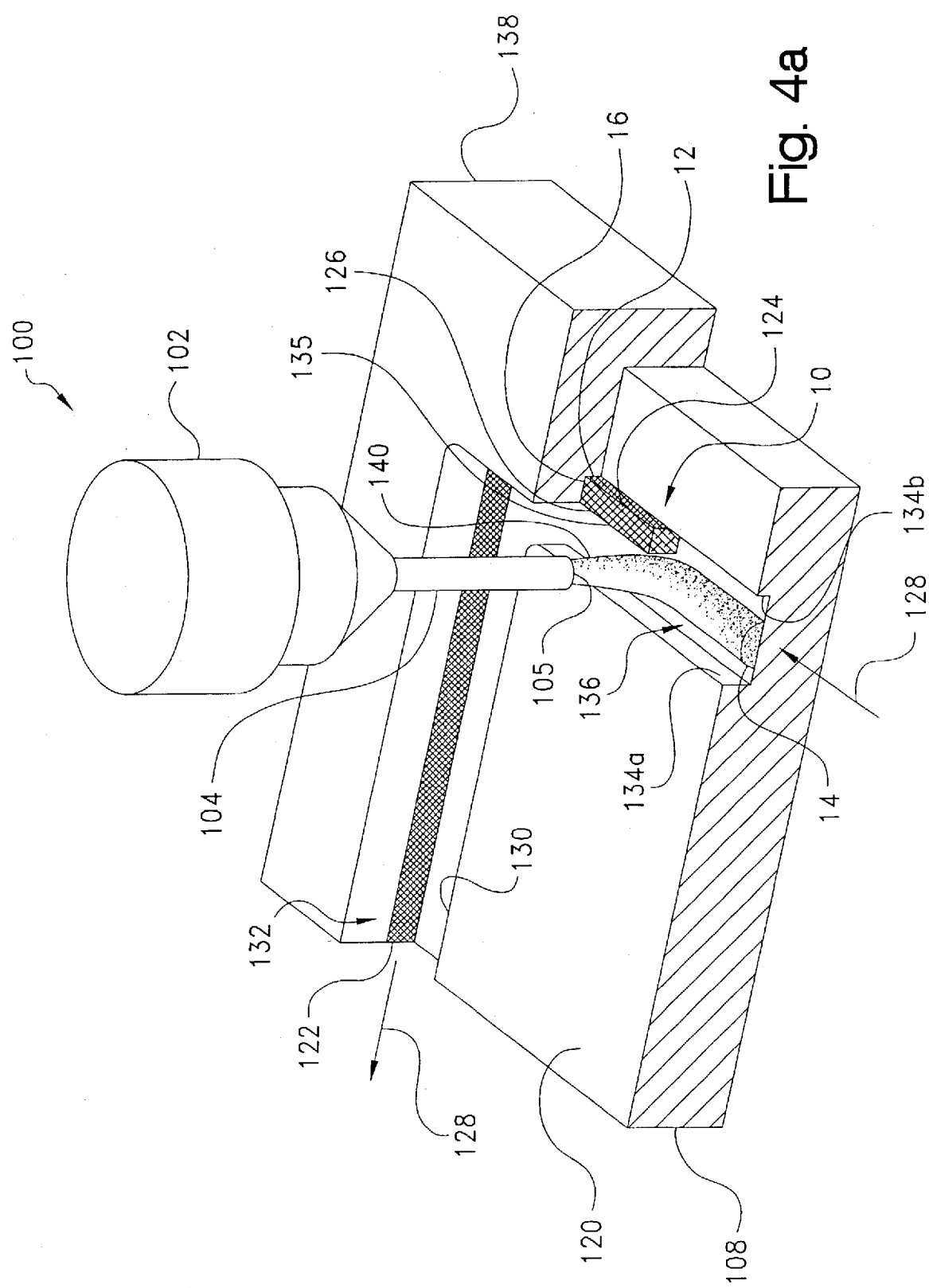
FIG. 4A is a perspective, cut-away view of a representative system for the manufacture of the combination gasket construction according to the present invention.

The drawings will be described further in connection with the following Detailed Description of the Invention.

DETAILED DESCRIPTION OF THE INVENTION

Certain terminology may be employed in the description to follow for convenience rather than for any limiting purpose. For example, the terms "forward," "rearward," "right," "left," "upper," and "lower" designate directions in the drawings to which reference is made, with the terms "inward," "interior," "inner," or "inboard" and "outward," "exterior," "outer," or "outboard" referring, respectively, to directions toward and away from the center of the referenced element, and the terms "radial" or "horizontal" and "axial" or "vertical" referring, respectively, to directions, axes, planes perpendicular and parallel to the central longitudinal axis of the referenced element. Terminology of similar import other than the words specifically mentioned above likewise is to be considered as being used for purposes of convenience rather than in any limiting sense. Further, the term "EMI shielding" should be understood to include, and to be used interchangeably with, electromagnetic compatibility (EMC), electrical conduction and/or grounding, corona shielding, radio frequency interference (RFI) shielding, and anti-static, i.e., electro-static discharge (ESD) protection.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the purposes of the discourse to follow, the precepts of the combination gasket structure and method of the invention herein involved are described in connection with its manufacture for use as, for example, a picture-frame-type gasket for a door, access panel, cover, hatch, or other part or parting line of a cabinet, housing, or other enclosure which may be an indoor outdoor enclosure for communications, computer, or other electronic or electrical equipment, devices, or the like which generates EMI radiation and/or which is susceptible to the effects thereof. Such gasket structure, which alternatively may be of an elongate strip-type, and which also may be used between circuit boards, card cages, vents, covers, PCMCIA cards, back or face planes, shielding caps or cans, or I/O connector panels, may be bonded or fastened to, or press-fit into one of a pair of mating surfaces which define an interface or parting line within the enclosure, device, or equipment, and functions between the mating surfaces to seal any interface gaps or other irregularities. That is, while under an applied pressure, the gasket resiliently conforms to any such irregularities both to establish a continuous conductive path across the interface, and to environmentally seal, for example, the interior of the housing against the ingress of dust, moisture, or other contaminates.

In view of the discourse to follow, however, it will be appreciated that aspects of the present invention may find utility in other applications requiring a resilient, electrically conductive seal, gasket, fencing, or other connection, screen, or shield for EMI shielding or other purpose. Use within those such other applications therefore should be considered to be expressly within the scope of the present invention.

Referring then to the figures wherein corresponding reference characters are used to designate corresponding elements throughout the several views with equivalent elements being referenced with prime or sequential alphanumeric designations, a representative combination EMI shielding and environmental sealing gasket construction in accordance with the present invention is shown generally at 10 in the top view of FIG. 1 as including at least one electrically-conductive EMI shielding gasket member, 12, which may be generally resilient, and at least one environmental sealing gasket member, 14, which also may be generally resilient and typically more resilient than the shielding gasket member 12, and which may be foamed or other formed-in-place formed in the manner to be described hereinafter to be integral with the shielding gasket member 12. In the illustrative embodiment of FIG. 1, and as may be seen with additional reference to the cross-sectional view of FIG. 2A, the shielding gasket member 12 is provided as a generally elongate strip which extends along a typically longer or lengthwise extent, referenced in the direction of the arrows numbered labeled "$\lambda_{1-4}$" in FIG. 1, and a typically shorter or widthwise extent, referenced at "w" in FIG. 2A, which is defined by an outer periphery, referenced at 16 in FIG. 2A, of the shielding gasket member 12. As may be seen in FIG. 1, the lengthwise extent $\lambda$ of the shielding gasket member 12 may follow a generally continuous path, the perimeter of which defines an enclosed geometric area which may be generally polygonal as shown or, alternatively, and depending particularly upon the requirements of the intended application, generally arcuate or complexly-shaped, and as having one or more internal regions (not shown) which may be defined by one or more transverse or parallel fences which also may be formed by the shielding gasket member 12.

Although one or more strips or lengths of the gasket 10 may be spliced, such as is shown in phantom at 18 in FIG. 1, to form the geometry shown, it may be preferred that such geometry be formed in a generally unitary construction such as in the manner to be described hereinafter. Also, and as is known, in the gasket art, the sealing gasket member 14 may be formed or otherwise provided as having one or more apertures or inserts, one of which is reference in phantom at 19 in FIG. 1, formed therethrough. Such apertures or inserts 19 may function as holes to receive bolts or other fasteners used for the mounting of the gasket 10 to the part, and/or as compression steps to control the deflection of the sealing gasket member 14 when the gasket 10 is placed under compression.

For many applications, it may be preferred that that the shielding gasket member 12 be provided as a mesh, spring mesh, fabric, or other fibrous material which has been knitted, woven, needled, rolled, compressed, or otherwise formed into the profile, which may be the square cross-section shown in FIG. 2A or, alternatively, single, double, or more of generally "solid," i.e., non-hollow, or hollow polygonal, circular, elliptical, or other curved shape, D-shape, "finned" or P-shaped, or other shape, of the shielding gasket member 12. To render the shielding gasket member 12 electrically conductive, such as to a resistivity of between about 0.00008–0.001 $\Omega$-cm, but as may depend upon the deflection under compression or other load, the fibrous material may be formed of wires, monofilaments, yarns, bundles, or other fibers which may be inherently electrically-conductive or, alternatively, which may be non-conductive and which are rendered conductive by reason of an coating, plating, or other surface-applied layer of an electrically-conductive material. Representative inherently electrically-conductive fibers include metals such as copper, nickel, silver, aluminum, steel, tin, and bronze, alloys thereof such as Monel nickel-copper alloy, and plated or clad fibers such as one or more of copper, nickel, silver, aluminum, steel, tin, bronze, or an alloy thereof coated with one or more of copper, nickel, silver, aluminum, steel, tin, bronze, or an alloy thereof, e.g., silver-plated copper, nickel-clad copper, Ferrex® (Parker Chomerics, Woburn, Mass.) tin-plated copper-clad steel, tin-clad copper, and tin-plated phosphor bronze, non-metals such as carbon, graphite, and inherently conductive polymers. Representative non-conductive fibers include cotton, wool, silk, cellulose, polyester, polyamide, nylon, and polyimide monofilaments or yarns which are plated, clad, or otherwise coated with an electrically-conductive material which may be a metal such as copper, nickel, silver, aluminum, tin, or an alloy or combination thereof, or a non-metal such as carbon, graphite, or conductive polymer, thereof As is known, the plating, cladding, or other coating may applied to individual fiber strands or to the surfaces of the fabric after weaving, knitting, or other fabrication. Combinations such as of one or more of the foregoing conductive fibers, one or more of the foregoing coated non-conductive fibers, and one or more of the foregoing conductive fibers and one or more of the foregoing coated non-conductive fibers also may be employed. With shielding gasket member 12 being so formed, the combination gasket 10 of the present invention may exhibit an EMI shielding effectiveness, such as in accordance with CHO-TM-TP08 TP57 (Chomerics Test Procedure, Parker Chomerics Division, Woburn, Mass.), of at least about 50 dB substantially over a frequency range of between about 200 MHz and about 1 GHz.

Referring now momentarily to the cross-sectional view of FIG. 3A wherein an alternative embodiment of combination gasket 10 of FIG. 1 is shown at 10', for other applications it may be preferred that the shielding gasket member 12 be provided, as is shown at 12', as one or more layers, 20, of a mesh, fabric, or other fibrous material which is knitted, woven, needled, wrapped, wound, or otherwise sheathed over an elongate core, 22, which may be hollow or tubular as shown or, alternatively, solid. The profile of the shielding gasket member 12', as determined essentially by the profile of the core 22, as well as the composition of the fibrous material forming the layer 20, may be as was described in connection with member 12. For affording gap-filling capabilities, the core 22 typically will be formed of an elastomeric polymeric material selected to be to compliant over a wide range of temperatures, and to exhibit good compression. Exemplary of such materials include foamed, e.g., closed or open cell foams or sponges, or unfoamed elastomers and elastomer-like materials such as silicones, polyurethanes, neoprenes, nitrites, butadiene, chlorosulfonates, polyolefins, and blends and copolymer rubbers such as polypropylene-EPDM and styrene-butadiene.

Returning to FIG. 1, the sealing gasket member 14 extends along at least a portion and, for most applications and as is shown, along the entirety or substantiality the entirety of the lengthwise extent $\lambda$ of the shielding gasket member 12. Although the combination gasket 10 of the invention is shown in the illustrated arrangement of FIG. 1 to have sealing gasket member 14 extending along the inside perimeter, 24, of the shielding gasket member 12, it will be appreciated that alternative arrangements may have a sealing gasket member 14 extending along the outside perimeter, 26, of the shielding gasket member 12, or along both of the perimeters. It further should be appreciated that multiple shielding gasket members 12 may be provided with one or more sealing gasket members 14 being provided along one or both of the perimeters of one or each of the shielding gasket members 12 or as extending between adjacent shielding gasket members 12. Also, although the shielding and sealing gasket members 12 and 14 are shown in the cross-sectional view of FIG. 2A to be of about the same height or thickness, referenced at "h," certain applications may call for one or the other of the gasket members 12 or 14 to be thicker or thinner than the other. The shielding and sealing gasket members likewise each may be of any width or of any relative width with respect to the other member, and of any aspect ratio, i.e., height to width, or relative aspect ratio.

With continued reference to FIG. 2A, and with additional reference to FIG. 2B wherein a magnified view of the region referenced at 28 in FIG. 2A is shown to better reveal the morphology of the interface, referenced at 30, between the gasket members 12 and 14, it may be seen that, in accordance with the precepts of the present invention, the shielding gasket member 12 is at least partially embedded in the sealing gasket member 14 to thereby form the integral composite structure of gasket 10. That is, and with particular reference to FIG. 2B, the outer periphery 16 of the shielding gasket member 12 may be seen to have interstitial spaces, such as is referenced at 32, therethrough which spaces 32 are defined between the fibers, one of which is referenced at 34, forming the body of the member 12. The material forming the sealing gasket member 14 is made to penetrate through the interstitial spaces 32 in the adjacent side, 36, of the shielding gasket member 12. Generally, the material of the sealing gasket member 14 will be made to penetrate into at least a boundary layer of the sealing gasket material 12, and typically less than about half of the widthwise extent thereof. In shear testing, cohesive failure modes have been observed indicating that the bond at the interface 30 between the shielding and sealing gasket members 12 and 14 is at least as strong or stronger than the bulk material of one or both of the members. Depending upon the materials used, such bond may generally will be physical or mechanical, such as in the form of a interpenetrating network, in nature, but instead or in additional may have a chemical or adhesive component or contribution from other forces electrostatic, van der Waals, hydrogen bonding, and the like.

Looking now to FIG. 3A, and with additional reference to FIG. 3B wherein a magnified view of the region 28' of FIG. 3A is shown, it may be seen that in the combination gasket construction 10', the elastomeric foam or other material forming the sealing gasket member 14' similarly is made to penetrate through the interstitial spaces 32' in the adjacent side 36' of the mesh layer 20 which surrounds the core 22. Shielding gasket member 12' thereby is at least partially embedded in the sealing gasket member 14' to form the integral composite structure of the gasket 10'.

In the gasket constructions of the present invention, the sealing gasket member 12 may be formed of an elastomeric polymeric material which specifically may be selected as depending upon one or more of operating temperature, compression set, force defection, flammability, compression set, or other chemical or physical properties. Depending, then, upon the application, suitable materials may include, natural rubbers such as Hevea, as well as thermoplastic, i.e., melt-processible, or thermosetting, i.e., vulcanizable, synthetic rubbers such as fluoropolymers, chlorosulfonates, polybutadienes, buna-N, butyls, neoprenes, nitrites, polyisoprenes, silicones, fluorosilicones, copolymer rubbers such as ethylene-propylene (EPR), ethylene-propylene-diene monomer (EPDM), nitrile-butadienes (NBR) and styrene-butadienes (SBR), or blends such as ethylene or propylene-EPDM, EPR, or NBR. The term "synthetic rubbers" also should be understood to encompass materials which alternatively may be classified broadly as thermoplastic or thermosetting elastomers such as polyurethanes, styrene-isoprene-styrene (SIS), and styrene-butadiene-styrene (SBS), as well as other polymers which exhibit rubber-like properties such as plasticized nylons, polyesters, ethylene vinyl acetates, polyolefins, and polyvinyl chlorides. As used herein, the term "elastomeric" is ascribed its conventional meaning of exhibiting rubber-like properties of compliancy, resiliency or compression deflection, low compression set, flexibility, and an ability to recover after deformation.

Although the material forming the sealing gasket member 12 may be unfoamed, it may be preferred for affording gap-filling capabilities in low closure force applications, i.e. between about 1–8 lb/inch (0.2–1.5 N/mm), that the material be an open, i.e., sponge, or closed cell foam. In the EMI shielding applications herein involved, foams generally are observed to complaint over a wide range of temperatures, and to exhibit good compression-relaxation hysteresis even after repeated cyclings or long compressive dwells. Shielding gasket member 12 therefore particularly may be formed of a foamed elastomeric thermoplastic such as a polyethylene, polypropylene, polypropylene-EPDM blend, butadiene, styrene-butadiene, nitrile, chlorosulfonate, or a foamed neoprene, polyurethane, or silicone. Particularly preferred materials for weather sealing applications requiring a moisture or other fluid seal are closed cell polyurethane or silicone foams which may have average cell size of about 10–300 $\mu$m, a density of between about 2–20 lb/ft$^3$ (0.03–0.3 g/cm$^3$) a compression set of less than about 20%, a force-deflection of between about 3–12 psi (20–80 kPa), and a hardness of about 90 Shore 00. Open cell foams having an outer skin also may be considered preferred in such applications.

Advantageously, by virtue to the presence of a separate shielding gasket member 12, the material of the sealing gasket member 14 need not be made conductive, such as by its loading with metal particles or other electrically-conductive fillers. Nonetheless, depending upon the requirements of the particular application, the material may contain fillers or other additives. In addition to electrically-conductive fillers, additional fillers and additives may include conventional wetting agents or surfactants, pigments, dyes, and other colorants, opacifying agents, anti-foaming agents, anti-static agents, coupling agents such as titanates, chain extending oils, tackifiers, pigments, lubricants, stabilizers, reinforcements, inert fillers such as elastomer, resin, or glass microspheres or balloons which may be gas-filled, emulsifiers, antioxidants, thickeners, and/or flame retardants such as aluminum trihydrate, antimony trioxide, metal oxides and salts, intercalated graphite particles, phosphate esters, decabromodiphenyl oxide, borates, phosphates, halogenated compounds, glass, silica, silicates, and mica. Typically, these fillers and additives may blended or otherwise admixed with the material formulation, and may comprise between about 0.05–80% by total volume thereof.

In the foam or form-in-place, i.e., in situ, method of the invention, the material for forming the sealing gasket member 12 may be provided as a fluent polymeric, one, two, or more part curable reaction system. Such system is especially adapted for use as a foam or form-in-place material in being dispensable as a generally non-slumping or otherwise form stable bead of a fluent, viscous material or admixture which may be dispensed from a nozzle or issued from another orifice onto the surface of a substrate which may be the part itself to be shielded or, alternatively, a mold or other form. Upon, for example, being heated in the case of a thermal addition polymerization, i.e., vulcanization or crosslinking mechanism, or, alternatively, reaction with atmospheric moisture or exposure to ultraviolet (UV) radiation or other curing mechanism such an anaerobic cure, the material may be cured in situ to form a resilient gasket profile which adheres to the substrate surface.

In a two-part embodiment, the reaction system of the present invention my be formulated as a fluent admixture of: (a) a first component, which may be a resin or resin precursor or prepolymer, having first functional groups; and (b) a second component, which may be a cross-linking agent or another resin precursor or prepolymer, having second functional groups reactive with the first functional groups of the first component. One or both of the first and second components contain a catalyst for the catalysis of the reaction between the first and second functional groups. Alternatively, in a three-part system, the catalyst may be provided as a third component or as admixed with the third component, and in a one-part system the catalyst my be provided in that part.

By "fluent," it is meant that the composition or admixture exhibits representative fluid flow characteristics allowing it to be extruded under pressure through a dispensing nozzle, needle, or other orifice at a given flow velocity. The uncured composition may also be formulated to be sufficiently viscous, e.g., 1,000–10,000 poise at 25° C., such that it may be dispensed on a substrate as a generally continuous, form-stable bead and thereafter cured with or without the use of a mold or other forming tool. By "form-stable," it is meant that the uncured bead of the composition which is applied to the substrate generally exhibits less than about 25% slump, sag, or running prior to the curing thereof. By "cured" it is meant that the composition is polymerized, cross-linked, further cross-linked or polymerized, vulcanized, cooled, hardened, dried, or otherwise chemically or physically changed from a liquid, semi-liquid, or other fluent form into a solid or semi-solid elastomeric or polymeric phase. Thermal addition cure systems, which may be foamed or unfoamed, of the general type herein involved are well-known and characterized by a curing mechanism involving the direct cross-linking reaction of functional group species on adjacent molecules which also may be oligomers or other prepolymers, or polymers. The cross-linking reaction is thermally accelerated and has a cure profile which may include a predefined cure or critical temperature for a given heating time.

The curing reaction may occur between the same molecules or functional groups, and alternatively may be moisture or UV-catalyzed at ambient temperature. In a thermal-cure, silicone-based embodiment, the system incorporates an elastomeric, silicone-based resin component having a first functional species, such as vinyl groups, and a silicone-based cross-linking agent having a second functional species, such as hydride groups, different from the first functional species but which are reactive therewith. That is, the first and second species exhibit reactive affinity above a certain activation energy level such that a thermally-induced cross-linking reaction is effected at temperatures at or above a particular cure temperature resulting in the curing of the reaction system to form a form-stable elastomeric material. As used herein, the term "elastomeric" is ascribed its conventional meaning of exhibiting rubber-like properties of compliancy, resiliency, low compression set, flexibility, and an ability to recover after deformation, i.e., stress relaxation. As with silicone elastomers in general, the preferred silicone material exhibits properties such as thermal and oxidation resistance over a wide temperature range, and well as resistance to many chemicals and to weather effects, which makes it especially suited for use as an EMI shielding gasket. In addition to improved corrosion resistance, the material further exhibits excellent electrical properties including resistance to corona breakdown over a wide range of temperatures and humidity.

Together, the resin and cross-linking component, each of which may have a respective weight average molecular weight of between about 70,000–90,000, may be classified as a silicone-based, thermal-addition curable or cross-linking elastomeric composition. A particularly preferred formulation includes a linear vinyl-terminated siloxane polymer, such as vinyl-terminated polydimethyl siloxane, as the resin component, and at least a stoichiometric, molar amount of a hydride-terminated siloxane, siloxane polymer, or siloxane copolymer, as the cross-linking agent. In a preferred embodiment of the invention, the resin and cross-linking agent components are admixed in a one-part system. Alternatively, the resin component may be included in a first part of a two-part system, with the cross-linking agent component being included in a second part formulated to be mixed in equal volumetric proportion with the first component part. In either system, one or both parts additionally may include a carrier, such as a silicone or silicone-compatible fluid, a diluent such as toluene, alcohol, or other organic solvent, or additional resin component including the first functional group species.

An inhibitor such as 2-methyl, 3-butyn 20', polyvinylmethyl siloxane, or octamethyltrisiloxane optionally may be included in the single part or in the second part of the two-part formulation for inhibiting the reaction at room temperature between the first and second functional group species and thereby increasing the pot-life or open-time of the mixture. At elevated curing temperatures of from about 85–150° C., however, the inhibitor is volatilized to thereby allow the cross-linking reaction between the first and second functional groups to proceed to cure. A metallic catalyst, such as an organometallic platinum catalyst, likewise may be included the single part or in the first part of the two-part formulation to catalyze the thermal addition cross-linking reaction between the first and second functional groups. Generally, from about 5–10 ppm of such catalyst, based on the total weight of the functional siloxane components, is included with the first component.

Other polymeric materials which may be generally suitable for use include natural rubbers such as Hevea and thermoplastic, i.e., melt-processible, or thermosetting, i.e., vulcanizable, synthetic rubbers such as fluoropolymer, chlorosulfonate, polybutadiene, butyl, neoprene, nitrile, polyisoprene, buna-N, copolymer rubbers such as ethylene-propylene (EPR), ethylene-propylene-diene monomer (EPDM), nitrile-butadiene (NBR) and styrene-butadiene (SBR), or blends such as ethylene or propylene-EPDM, EPR, or NBR. The term "synthetic rubbers" also should be understood to encompass materials which alternatively may be classified broadly as thermoplastic or thermosetting elastomers such as polyurethanes, silicones, fluorosilicones, styrene-isoprene-styrene (SIS), and styrene-butadiene-styrene (SBS), as well as other polymers which exhibit rubber-like properties such as plasticized nylons, polyesters, ethylene vinyl acetates, and polyvinyl chlorides. In another preferred formulation, the system may be polyurethane-based, which polyurethane may be a thermoplastic polyurethane (TPU) or thermosetting, and which may be based on a urethane linkage reaction between a diisocyante, such as diphenylmethane diisocyanate (MDI), tolidine diisocyanate (TODI), or p-phenylenediisocyanate (PPDI), and a polyol which may be polyether, polyester, or other resin-based.

As aforementioned, a solvent or other diluent may be employed during the compounding of the formulation to lower the viscosity of the material for improved mixing and delivery. Other conventional rheological agents and additives, such as pigments, microwave-attenuating or thermally-conductive fillers, lubricants, wetting agents, stabilizers, antioxidants, coloring or opacifying agents, fire retardants, chain extending oils, tackifiers, blowing agents, foaming or anti-foaming agents, and the like, optionally may be incorporated into the formulation depending upon the requirements of the particular application envisioned. In the case of a foam, the dispensed material may be foamed-in-place, i.e., in situ, under the control of a physical blowing agent, such as nitrogen, carbon dioxide, or other gas, or a chemical blowing agent, which may be an organic compound or an inorganic compound such as water, which decomposes or volatilizes to generate a gas.

As formed or foamed-in-place on the surface of a substrate, the cured material forming the sealing gasket member within the combination gasket of the present invention may be formulated to exhibit primed or primerless adhesion to the substrate in the case where the combination gasket is being formed directly on the part, such as a door or access panel, which may be a metal such as aluminum, magnesium, nickel, copper, or a plastic, of the equipment or device to be sealed. Where the combination gasket being foamed or formed-in-place is desired to be removed from the substrate, such as for separate attachment to the part to be sealed by means of fasteners or and adhesive, such substrate or surface thereof may be formed of a material, or provided with a coating thereof, to which the material of the sealing gasket member does not adhere, or such surface may be treated with a mold release or similar agent.

For commercial production, the constituents of the reaction system may be compounded in a roll mill or other mixer. After compounding, the pre-mixed one or more component parts may be loaded into individual tubes or containers and stored for later reactive processing using a hand-held caulking gun, which may be of a cartridge-fed, static-mixer variety, or, alternatively, using automated injection equipment such as a robotic applicator having two or more degrees of freedom or an x-y table with a stationary dispensing head. For two or more part systems, the respective component parts may be admixed immediately prior to application, and then delivered as a bead of a reactive mixture to a surface of a housing or other enclosure or substrate. The mixture then is cured in situ on the substrate surface under substantially atmospheric pressure, or as may be contacted with a mold or other forming tool. To reduce the cycle time, the curing may be effected at an elevated temperature to accelerate the vulcanization reaction. The components alternatively may be pre-mixed and frozen for storage.

Referring now again to the figures, a representative commercial dispensing system for the production of the combination gasket construction, such as the construction 10 illustrated in FIG. 1, of the present invention is shown generally at 100 in the plan view of FIG. 4A as including a roboticly-controlled dispense gantry, 102, having a nozzle, 104, with an orifice, 105, of a select diameter. Dispense gantry 102 is provided to be in fluid communication with a material supply system (not shown), which may include one or more proportional, pneumatically-controlled cylinders or, alternatively, pumps for delivering an apportioned amount of each of the one, two, or multi- part system components through an in-line static or dynamic mixer or the like. Thereafter, the admixed components may be passed to another proportioning, pneumatic cylinder for controlled delivery to gantry 102, or directly to the nozzle 104.

Gantry 102 is operated for movement in one or more axes relative to an associated table or the like (not shown). Such table, which may be stationary or also movable in one or more axes relative to gantry 102, supports a workpiece or substrate, 108, thereon which, as is shown, may be a door or access panel of a cabinet, housing, or other enclosure, or part of an electrical or electronic device or equipment, or alternatively, a mold or other form. Substrate. 108 has an upper surface, 120, which supports a length, preform, or other form, 122, which may be provided as a strip of the shielding gasket member 12 or as a shape thereof that has been knitted, compressed, spliced, or otherwise fabricated into the desired geometric shape or configuration. The outer, 124, and/or inner, 126, perimeter of the length, form, or preform 122 defines a predetermined path, designated by the arrows commonly numbered 128, along which gantry 102 and/or the table is traceable or otherwise movable.

The form 122 may be supported directly on the surface 120 of the substrate 108, or, alternatively and as is shown in FIG. 4A, as disposed on a bottom wall, 130, of a groove or channel, shown generally at 132, the lengthwise extent of the groove 132 tracing the path 128. As may be seen, groove 132 additionally has a pair of sidewalls, 134a–b, which may be generally upstanding or otherwise oriented, and which adjoin the bottom wall 130 the bottom wall and are spaced-apart to define a widthwise extent of the groove 132 therebetween. In the lay-up of the gasket construction 10, the strip, preform, or other form 122 of the shielding gasket member 12 may be received within the groove 132 to extend along that portion thereof which traces the path 128, with the outer periphery 16 of the form 122 being received intermediate the groove sidewalls 134. In such disposition, the outer periphery 16 has at least one side, referenced at 135, which is spaced-apart from an adjacent on of the sidewalls, such as the sidewall 134a as shown, to define a predetermined clearance, referenced at 136, therebetween. Of course, depending upon the configuration of the gasket construction 10, one or more forms 122 may be positioned, typically in a spaced-apart arrangement, within the groove 132, the widthwise extent thereof which may be sized to accommodate two or more of such forms 122. A fixture, 138, maybe used to hold the form 122 in position. Fixture 138 also may function as a cover or shield over the otherwise exposed portions of the outer periphery 16 of the form 122, other than the side 135, so as to ensure that the foam or other material contacts substantially only the side 135 and the remainder of the outer periphery 16 remains substantially free of the material.

With the lay-up being preformed as described, as one or both of the gantry 102 or table 106 is translated relative to the other, an uncured, partially-cured, or otherwise fluent, typically viscoelastic bead, referenced at 140, which may be generally non-slumping or otherwise substantially form stable, of the material or admixed material for forming the sealing gasket member 14 may be issued under an applied pressure from nozzle 104 of gantry 102 generally along one or more, as depending upon the number of sealing gasket members 14 desired in the completed gasket construction, path 128. The bead 140 is dispensed between the side 135 of the form 122 and the adjacent wall 134a, and penetrates at least partially into the form 122 through the side 135 thereof. In general, and particularly in the case of a foam-in-place material which may experience a volume expansion of between about 3–32× or more, the bead 140 also may substantially fill the clearance 136.

As shown in FIG. 4A, the dispensed bead, in a free-formed process, may assume the generally D-shaped cross-section characteristic of gaskets which are formed-in-place under atmospheric or other ambient pressure. Following the completion of the dispensing of the bead 140, the substrate 108 may be heated or the sealing gasket member 12 so formed may be heated or otherwise cured to form the integral gasket construction 10 of the invention.

Figure 4B:
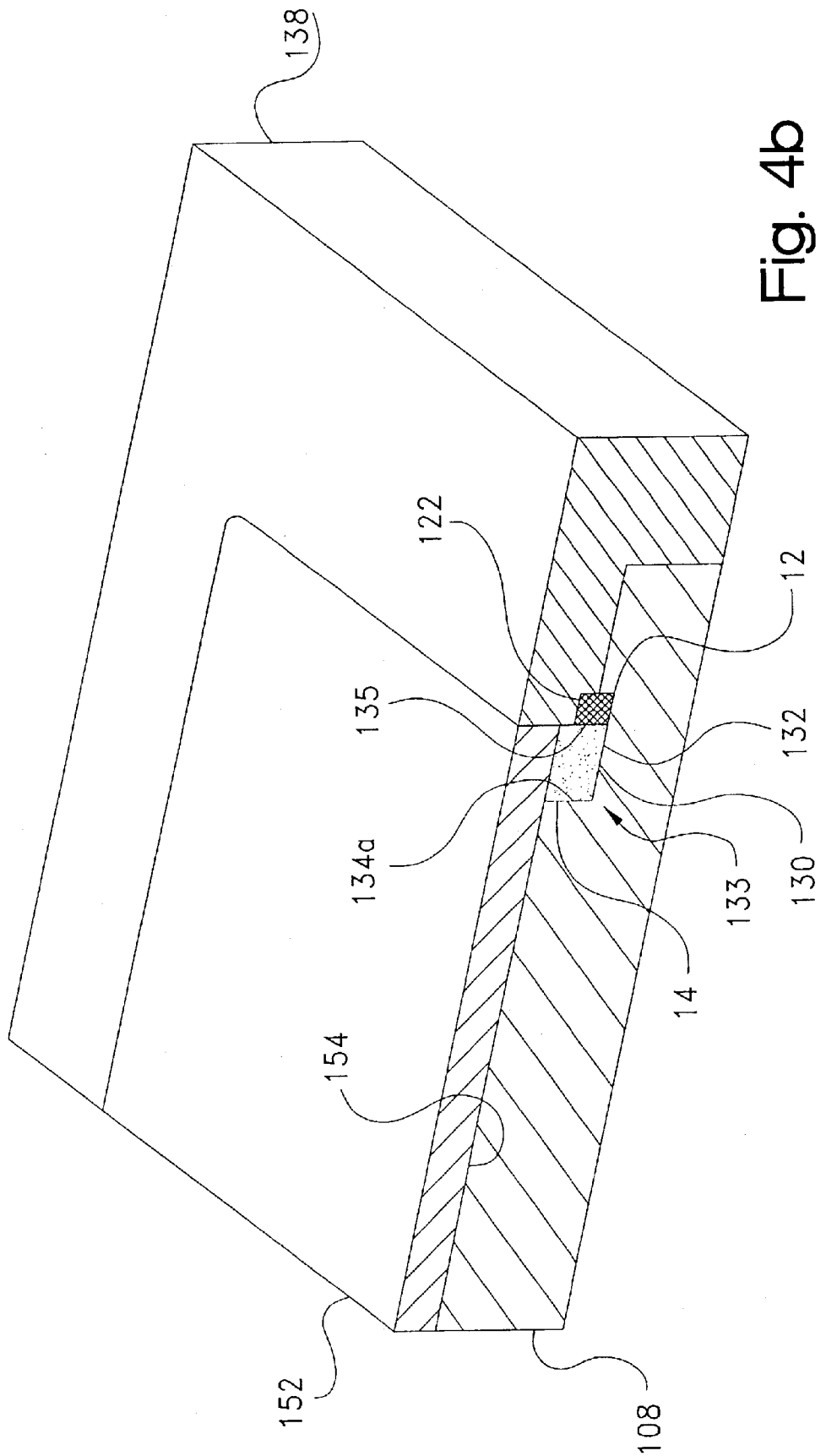
FIG. 4B is a view as in FIG. 4A illustrating an additional operation of the system of FIG. 4A.

Alternatively, for other shape cross-sectional profiles such as square, rectangular, or other polygonal, the uncured, partially-cured, curing, or, such as in the case of a thermoplastic material, cured bead 140, which may be foamed, unfoamed, or in the process of foaming, may be contacted, as is shown at 150 in FIG. 4B, with a heated or unheated cover or other forming tool, 152. With the cover 152 being applied over the groove 132, a cavity, 153, of a predetermined shape may be defined between a facing surface, 154, of the cover 152, the bottom 130 and sidewall 134a of the groove 132, and the side 135 of the form 122, with the formed or forming sealing gasket member 14 being contained within the cavity 153 and substantially assuming the shape thereof. Moreover, one or more of the surfaces 154, 130, and 134b may be profiled, textured, or otherwise formed to so mold or otherwise impart such profile, texture, or form in the corresponding surface of the sealing gasket member 12. Advantageously, the use of a cover 152 may assist in the flow of the material to increase the penetration thereof into the interstices of the shielding gasket member 12, and to better conform the sealing gasket member 14 around the side 135 of the shielding gasket member 12 such as is shown at 160 in and 160' in FIGS. 2A and 3A.

As mentioned, the sealing gasket member 14 may itself be used to adhesively or otherwise bond the gasket 10 to the substrate 108 such as when the substrate is the part to be sealed. In this regard, the substrate may be formed of a thermoplastic or other polymeric material such as a poly (ether ether ketone), polyimide, high molecular weight polyethylene, polypropylene, polyetherimide, polybutylene terephthalate, nylon, fluoropolymer, polysulfone, polyester, ABS, acetal homo or copolymer, or a liquid crystal polymer, of a metal such as steel, magnesium, or aluminum, or of a non-conductive material such as a plastic which is painted, metallized, or otherwise provided with a metal or metal-filled coating layer. Also, when a groove 132 is employed, the expansion of the bead 140 therewithin may effect an interference fit or other mechanical engagement of the gasket 10 within the groove 132. Alternatively, the gasket 10 so formed in accordance with the method of the invention may be removed from the substrate 108 and attached to the part to be shielded in a separate operation using conventional mounting means such as adhesives, fasteners, interference fits, and the like.

As it is anticipated that certain changes may be made in the present invention without departing from the precepts herein involved, it is intended that all matter contained in the foregoing description shall be interpreted as illustrative and not in a limiting sense. All references including any priority documents cited herein are expressly incorporated by reference.

What is claimed is:

1. A combination gasket comprising:
   at least one electrically-conductive EMI shielding gasket member having a lengthwise extent and widthwise extent defined by an outer periphery, the outer periphery having interstitial spaces therethrough; and
   at least one environmental sealing gasket member integral with the shielding gasket member, the sealing gasket member extending along at least a portion of the lengthwise extent of the shielding gasket member and being formed of a material which penetrates through the outer periphery of the shielding gasket member into at least a portion of the interstitial spaces thereof to bond the shielding gasket member to the sealing gasket member.

2. The combination gasket of claim 1 wherein said shielding gasket member comprises one or more electrically-conductive fibers, the interstitial spaces being formed between the fibers.

3. The combination gasket of claim 2 wherein the electrically-conductive fibers are non-conductive fibers having an electrically-conductive coating, metal wires, carbon fibers, graphite fibers, inherently-conductive polymer fibers, or a combination thereof.

4. The combination gasket of claim 2 wherein:
   the non-conductive fibers are cotton, wool, silk, cellulose, polyester, polyamide, nylon, polyimide, or a combination thereof, and the electrically-conductive coating is copper, nickel, silver, aluminum, tin, carbon, graphite, or an alloy or combination thereof; and
   the metal wires are copper, nickel, silver, aluminum, bronze, steel, tin, or an alloy or combination thereof, or one or more of copper, nickel, silver, aluminum, bronze, steel, tin, or an alloy or combination thereof coated with one or more of copper, nickel, silver, aluminum, bronze, steel, tin, or an alloy or combination thereof.

5. The combination gasket of claim 2 wherein the shielding gasket member is formed as a strip which comprises a fabric or mesh of the electrically-conductive fibers.

6. The combination gasket of claim 5 wherein:
   the strip is formed as having a side disposed adjacent the sealing gasket member; and
   the material forming the sealing gasket member penetrates into the interstitial spaces of the shielding gasket member though the adjacent side of the strip.

7. The combination gasket of claim 5 wherein the shielding gasket member further comprises a resilient core, the mesh or fabric being provided in one or more layers surrounding the core.

8. The combination gasket of claim 7 wherein the core is formed of an elastomeric material.

9. The combination gasket of claim 1 wherein the lengthwise extent of the shielding gasket member defines an closed geometric area.

10. The combination gasket of claim 9 wherein the sealing gasket member extends along substantially the entirety of the lengthwise extent to the shielding gasket member.

11. The combination gasket of claim 9 wherein the lengthwise extent of the shielding gasket member is generally continuous.

12. The combination gasket of claim 1 wherein the material forming the sealing gasket member is a polymeric material.

13. The combination gasket of claim 12 wherein the polymeric material is foamed.

14. The combination gasket of claim 13 wherein the polymeric material is selected from the group consisting of polyethylenes, polypropylenes, polypropylene-EPDM blends, butadienes, styrene-butadienes, nitrites, chlorosulfonates, neoprenes, polyurethanes, urethanes, silicones, copolymer blends, and combinations thereof.

15. The combination gasket of claim 12 wherein the polymeric material is elastomeric.

16. A method of making a combination gasket comprising the steps of:
   (a) providing a surface;
   (b) disposing at least one electrically-conductive EMI shielding gasket member on the surface, the shielding gasket member having a lengthwise extent supported on the surface and a widthwise extent defined by an outer periphery, the outer periphery having interstitial spaces therethrough;
   (c) applying a curable material on the surface and adjacent the shielding gasket member outer periphery, at least a portion of the material penetrating through the outer periphery and into at least a portion of the interstitial spaces of the shielding gasket member; and
   (d) curing the material to form an environmental sealing gasket member, whereby the portion of the material penetrating into the interstitial spaces of the shielding gasket member bonds the sealing gasket member thereto to form an integral combination gasket structure.

17. The method of claim 16 further comprising the additional step prior to step (c) of providing a nozzle having an orifice, the curable material being applied in step (c) as dispensed from the orifice of the nozzle.

18. The method of claim 17 wherein the nozzle is provided to be movable relative to the surface and is moved in step (c) along at least a portion of the lengthwise extent of the shielding gasket member, and whereby the sealing gasket member is formed in step (d) along said portion of the lengthwise extent of the shielding gasket member.

19. The method of claim 16 wherein:

the surface is provided in step (a) as having a groove which extends along a lengthwise extent defining a path, the groove having a bottom wall and a pair of sidewalls adjoining the bottom wall, the sidewalls and being spaced-apart to define a widthwise extent of the groove therebetween;

the shielding gasket member is disposed in step (b) on the bottom wall of the groove, the widthwise extent of the shielding gasket member being received intermediate the groove sidewalls and the lengthwise extent of the shielding gasket member extending along at least a portion of the path defined by the lengthwise extent of the groove, the outer periphery of the shielding gasket member having at least one side which is spaced-apart from an adjacent one of the groove side walls;

the curable material is applied in step (c) by being introduced between at least the one side of the shielding gasket member outer periphery and the adjacent one of the groove side walls.

20. The method of claim 19 wherein:

the one side of the shielding gasket member is spaced-apart in step (b) from the adjacent one of the groove side walls to define a predetermined clearance therebetween; and the material applied in step (c) substantially fills said clearance.

21. The method of claim 16 further comprising the additional step of containing the material being applied in step (c) within a cavity having a shape, the sealing gasket member formed in step (d) having substantially the shape of the cavity.

22. The method of claim 16 wherein the sealing gasket member formed in step (d) has a generally D-shaped cross-sectional profile.

23. The method of claim 16 wherein said shielding gasket member comprises one or more electrically-conductive fibers, the interstitial spaces being formed between the fibers.

24. The method of claim 23 wherein the electrically-conductive fibers are non-conductive fibers having an electrically-conductive coating, metal wires, carbon fibers, graphite fibers, inherently-conductive polymer fibers, or a combination thereof.

25. The method of claim 24 wherein:

the non-conductive fibers are cotton, wool, silk, cellulose, polyester, polyamide, nylon, polyimide, or a combination thereof, and the electrically-conductive coating is copper, nickel, silver, aluminum, tin, carbon, graphite, or an alloy or combination thereof; and the metal wires are copper, nickel, silver, aluminum, bronze, steel, tin, or an alloy or combination thereof, or one or more of copper, nickel, silver, aluminum, bronze, steel, tin, or an alloy or combination thereof coated with one or more of copper, nickel, silver, aluminum, bronze, steel, tin, or an alloy or combination thereof.

26. The method of claim 23 wherein the shielding gasket member is formed as a strip which comprises a fabric or mesh of the electrically-conductive fibers.

27. The method of claim 26 wherein:

the strip is formed as having a side disposed adjacent the sealing gasket member; and the material forming the sealing gasket member penetrates into the interstitial spaces of the shielding gasket member though the adjacent side of the strip.

28. The method of claim 26 wherein the shielding gasket member further comprises a resilient core, the mesh or fabric being provided in one or more layers surrounding the core.

29. The method of claim 28 wherein the core is formed of an elastomeric material.

30. The method of claim 23 wherein the material forming the sealing gasket member is a polymeric material.

31. The method of claim 30 wherein the polymeric material is foamed-in-place on the surface prior to step (d).

32. The method of claim 31 wherein the polymeric material is selected from the group consisting of polyethylenes, polypropylenes, polypropylene-EPDM blends, butadienes, styrene-butadienes, nitrites, chlorosulfonates, neoprenes, polyurethanes, urethanes, silicones, copolymer blends, and combinations thereof.

33. The method of claim 30 wherein the polymeric material is elastomeric.

34. The method of claim 16 wherein the lengthwise extent of the shielding gasket member defines an closed geometric area.

35. The method of claim 34 wherein the sealing gasket member extends along substantially the entirety of the lengthwise extent to the shielding gasket member.

36. The method of claim 34 wherein the lengthwise extent of the shielding gasket member is generally continuous.

\* \* \* \* \*